(12) United States Patent
Naka et al.

(10) Patent No.: US 9,397,530 B2
(45) Date of Patent: Jul. 19, 2016

(54) CONTROL DEVICE AND ROTATING ELECTRIC MACHINE INTEGRAL WITH CONTROL DEVICE

(71) Applicant: Mitsubishi Electric Corporation, Chiyoda-ku, Tokyo (JP)

(72) Inventors: Shinji Naka, Tokyo (JP); Tadayuki Fujimoto, Tokyo (JP); Masaaki Tanigawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 596 days.

(21) Appl. No.: 13/871,568

(22) Filed: Apr. 26, 2013

(65) Prior Publication Data

US 2013/0313929 A1 Nov. 28, 2013

(30) Foreign Application Priority Data

May 24, 2012 (JP) ................................. 2012-118527

(51) Int. Cl.
*H02K 5/22* (2006.01)
*H02K 11/00* (2016.01)
*H02K 5/18* (2006.01)
*H05K 7/20* (2006.01)

(52) U.S. Cl.
CPC .................. *H02K 5/18* (2013.01); *H02K 5/225* (2013.01); *H02K 11/0073* (2013.01); *H02K 11/33* (2016.01); *H05K 7/2039* (2013.01)

(58) Field of Classification Search
CPC ..... H02K 5/22; H02K 5/225; H02K 11/0068; H02K 11/0073; H02K 11/0078; H02K 11/30; H02K 11/33

USPC .......................................................... 310/71
See application file for complete search history.

(56) References Cited

U.S. PATENT DOCUMENTS

2011/0291502 A1* 12/2011 Tang .................. H02K 11/0073
                                                                    310/71
2013/0334906 A1* 12/2013 Sonoda .............. H02K 11/0073
                                                                    310/43

FOREIGN PATENT DOCUMENTS

JP         2010-28925 A      2/2010
JP          4551166 B2       7/2010
JP     WO 2012160623 A1 *  11/2012   ......... H02K 11/0073

* cited by examiner

*Primary Examiner* — Quyen Leung
*Assistant Examiner* — Eric Johnson
(74) *Attorney, Agent, or Firm* — Sughrue Mion, PLLC

(57) ABSTRACT

A control device (28) includes: a housing (15); a control section including control-section connection terminals (5, 6, 7) and an electronic component (22); a heat sink (13); an external-connection connector (8) which includes connector connection terminals (9, 10, 11) to be electrically connected to the control-section connection terminals (5, 6, 7); and a cover (17). The connector connection terminals (9, 10, 11) and the control-section connection terminals (5, 6, 7) pass through a housing hole portion (16) covered with the cover (17) to be electrically connected to each other at respective distal end portions. Accordingly, in the control device having a different mounting direction of the external-connection connector or including a different type of the external-connection connector, the same housing, heat sink, and control section can be used so that manufacturing cost of the control device can be significantly reduced.

11 Claims, 14 Drawing Sheets

CONTROL DEVICE AND ROTATING ELECTRIC MACHINE INTEGRAL WITH CONTROL DEVICE

BACKGROUND OF THE INVENTION

1. Field of the Invention

The present invention relates to a control device having a structure which is adaptable to a change of a mounting direction of an external-connection connector and a change of a type of external-connection connector, and to a rotating electric machine integral with a control device, which is obtained by integrating the control device and a rotating electric machine.

2. Description of the Related Art

There is conventionally known a motor for an electric power steering device, which includes an external-connection connector and a control section including control-section connection terminals electrically connected to connector connection terminals of the external-connection connector. The external-connection connector and the control section are formed as a single component (for example, see Japanese Patent No. 4551166 (page 12, FIG. 1, and page 13, FIG. 3) and Japanese Patent Application Laid-open No. 2010-28925 (page 16, and FIGS. 1, 2, and 3)).

In the conventional motors for an electric power steering device, the control section including the control-section connection terminals and the external-connection connector are formed as a single integral component. Therefore, a different type of control device is required to be prepared, for example, when a direction of removal of the external-connection connector is different. Therefore, the conventional motors for an electric power steering device have a problem of increasing cost.

SUMMARY OF THE INVENTION

The present invention has been made to solve the problem described above, and therefore has an object to provide a control device capable of significantly reducing cost without the need of preparing a different type of control device for each change of a mounting direction of an external-connection connector and each change of the type of external-connection connector, and provide a rotating electric machine integral with a control device, which is obtained by integrating the control device and a rotating electric machine.

According to an exemplary embodiment of the present invention, there is provided a control device, including:

a housing having a cylindrical shape with a closed end, the housing including a housing projecting portion, and a housing hole portion formed through the housing projecting portion projecting in a radial direction;

a control section housed inside the housing, the control section including control-section connection terminals, to which an external signal is input from outside of the housing, and an electronic component for performing computation processing on the external signal;

a heat sink including a heat-sink projecting portion, and a heat-sink hole portion formed through the heat-sink projecting portion projecting in the radial direction, for closing an opening portion of the housing;

an external-connection connector to be fixed to one of the housing projecting portion and the heat-sink projecting portion, the external-connection connector including connector connection terminals to be electrically connected to the control-section connection terminals; and a cover to be fixed to another of the housing projecting portion and the heat-sink projecting portion, in which the connector connection terminals and the control-section connection terminals pass through one of the housing hole portion and the heat-sink hole portion, which is covered with the cover, so as to be electrically connected to each other at respective distal end portions.

Further, a rotating electric machine integral with a control device according to an exemplary embodiment of the present invention includes the above-mentioned control device and a rotating electric machine, which are integrated with each other.

According to the control device of the present invention, even when the control device has a different mounting direction of the external-connection connector or includes a different type of the external-connection connector, the same housing, heat sink, and control section can be used. As a result, manufacturing cost can be significantly reduced.

Further, according to the rotating electric machine integral with a control device of the present invention, even when the rotating electric machine integral with a control device has a different mounting direction of the external-connection connector or includes a different type of the external-connection connector, the same housing, heat sink, and control section can be used. As a result, manufacturing cost can be significantly reduced.

DETAILED DESCRIPTION OF THE PREFERRED EMBODIMENTS

Figure 1:
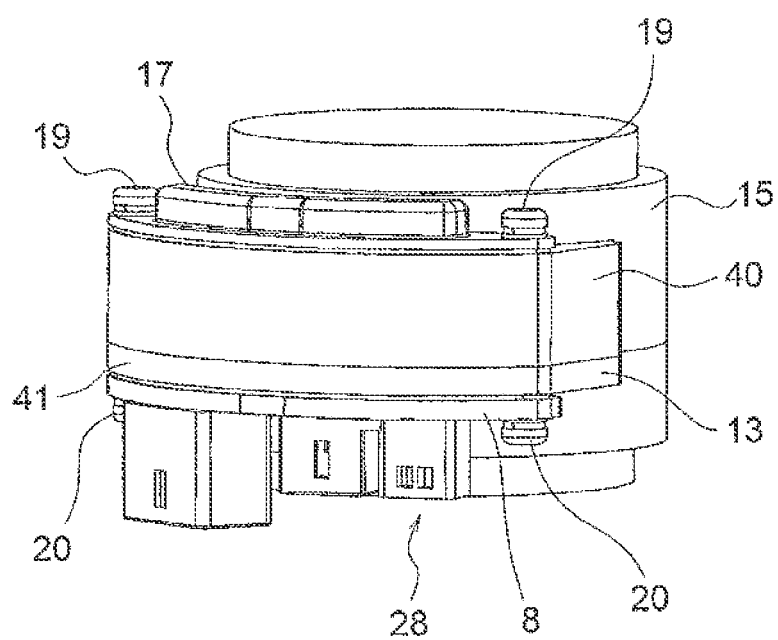
FIG. 1 is a perspective view illustrating a control device according to a first embodiment of the present invention.

Referring to the accompanying drawings, embodiments of the present invention are described below. In the drawings, the same or corresponding components and parts are denoted by the same reference symbols.

First Embodiment

Figure 2:
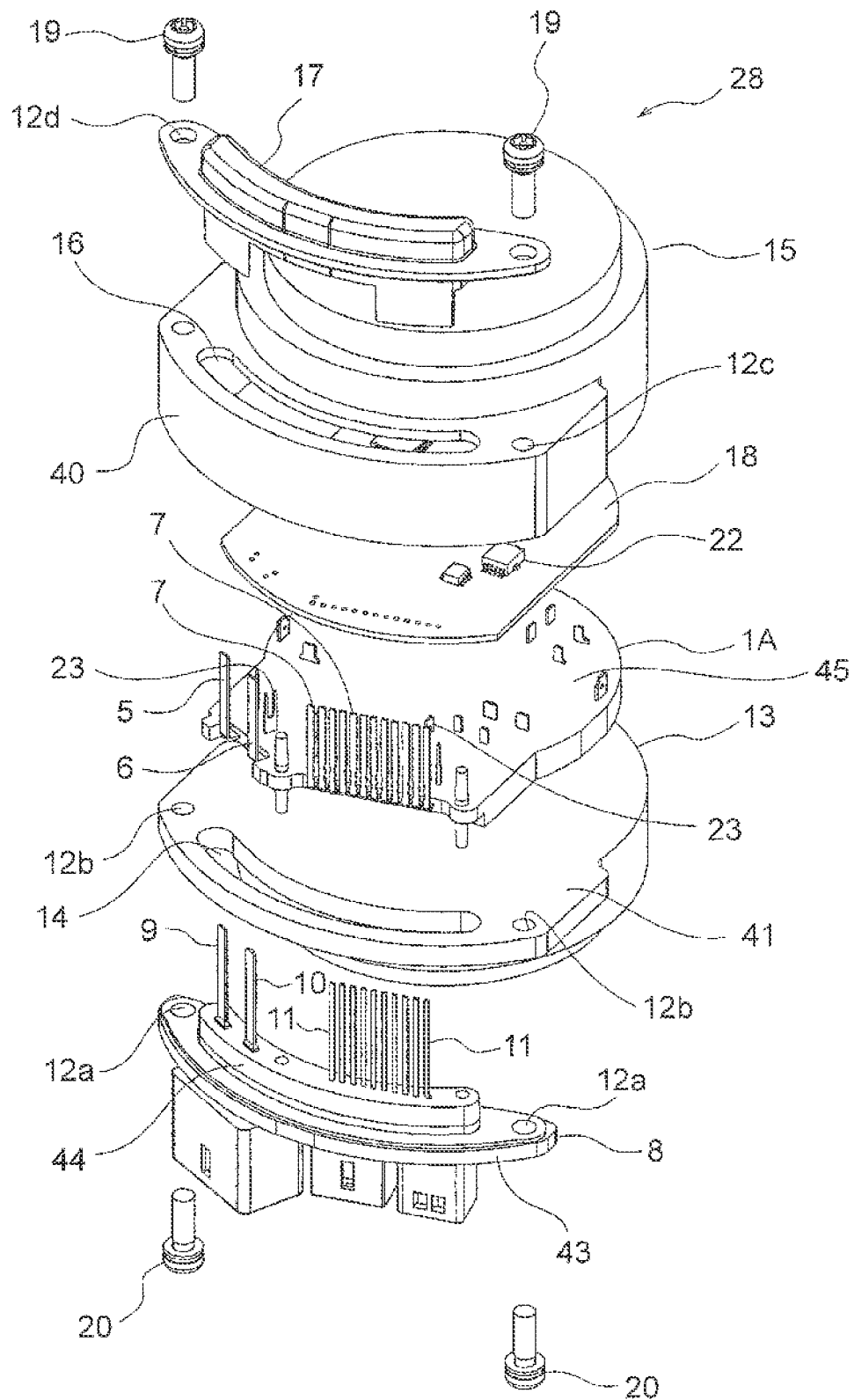
FIG. 2 is an exploded perspective view of the control device illustrated in FIG. 1.
Figure 3:
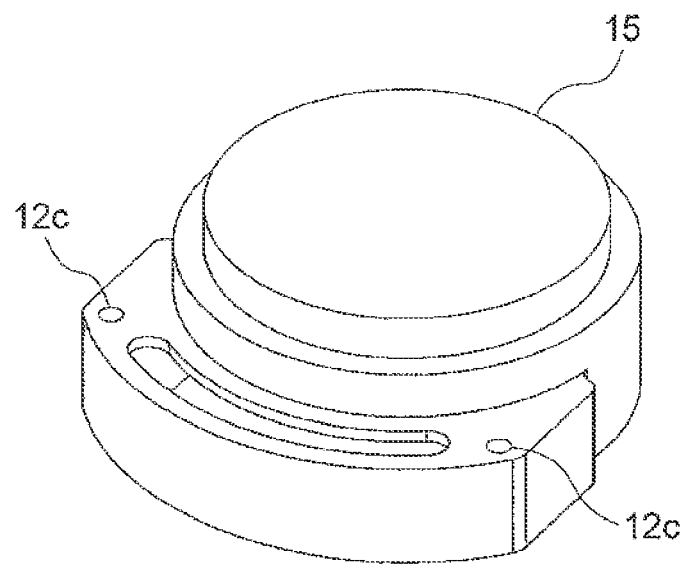
FIG. 3 is a perspective view of the housing illustrated in FIG. 2.
Figure 4:
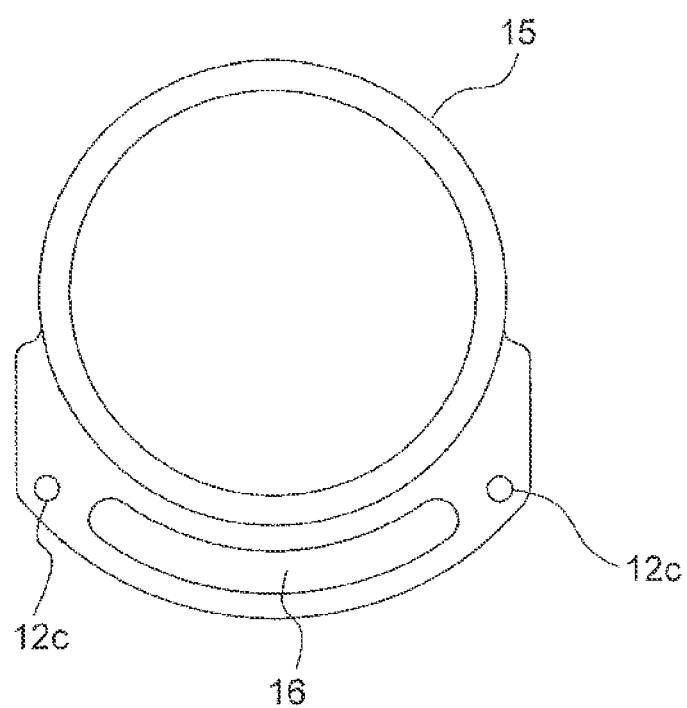
FIG. 4 is a plan view of the housing illustrated in FIG. 3.
Figure 5:
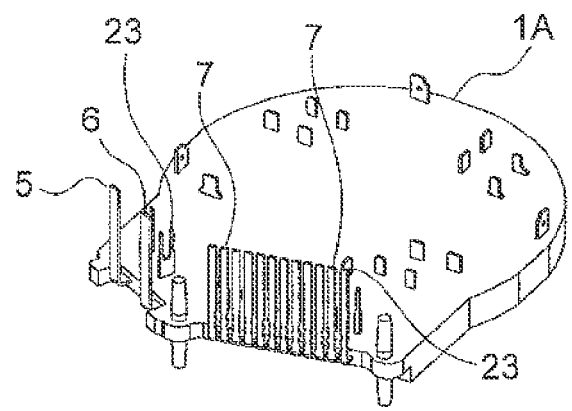
FIG. 5 is a perspective view illustrating the relay member illustrated in FIG. 2.
Figure 6:
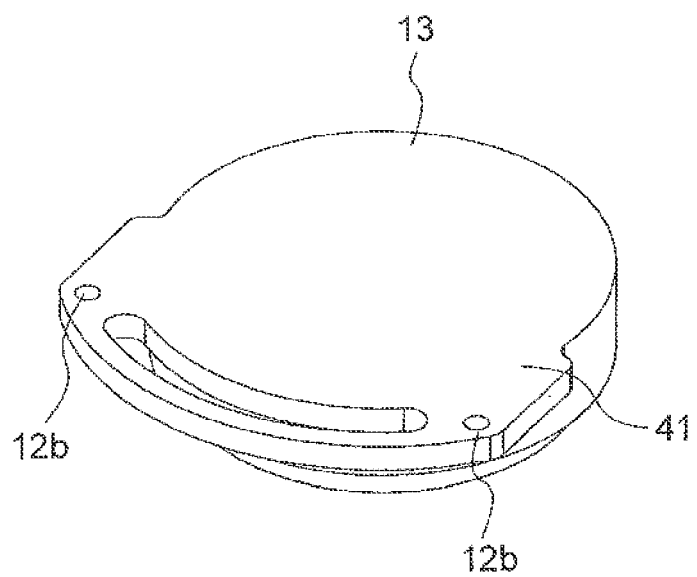
FIG. 6 is a perspective view illustrating the heat sink illustrated in FIG. 2.
Figure 7:
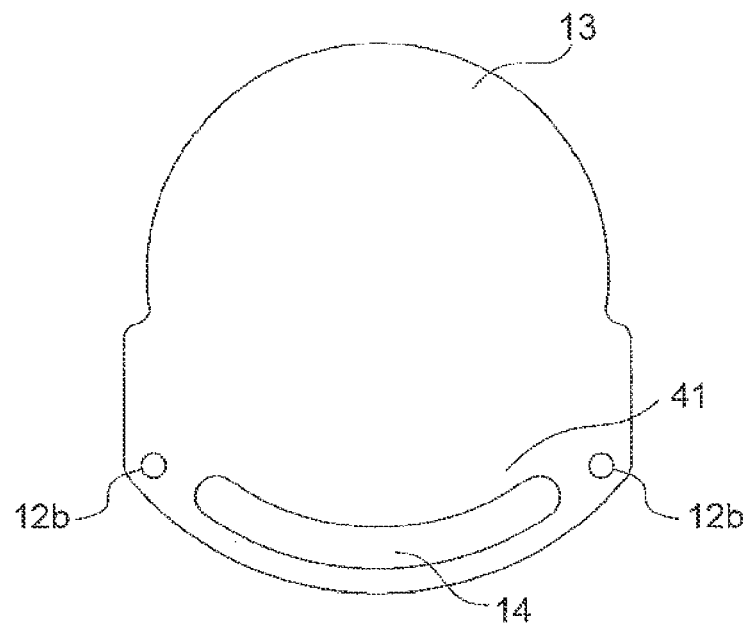
FIG. 7 is a plane view of the heat sink illustrated in FIG. 6.
Figure 8:
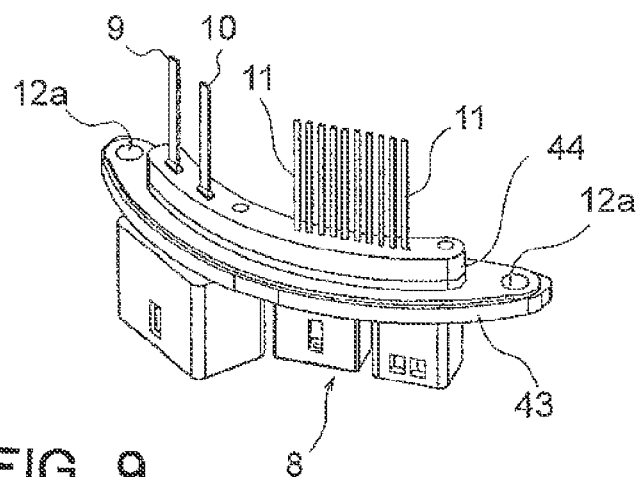
FIG. 8 is a perspective view of the external-connection connector illustrated in FIG. 2.
Figure 9:
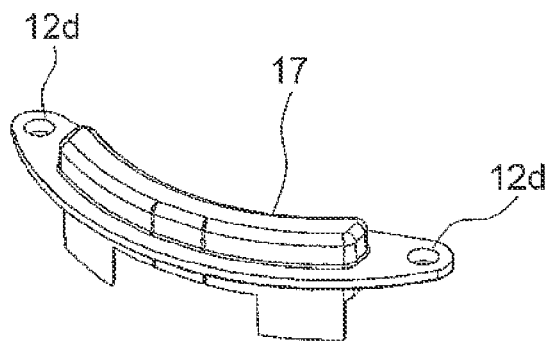
FIG. 9 is a perspective view of the cover illustrated in FIG. 2.

FIG. 1 is a perspective view illustrating a control device 28 according to a first embodiment of the present invention, FIG. 2 is an exploded perspective view of the control device 28 illustrated in FIG. 1, FIG. 3 is a perspective view of a housing 15 illustrated in FIG. 2, FIG. 4 is a plan view of the housing 15 illustrated in FIG. 3, FIG. 5 is a perspective view illustrating a relay member 1A illustrated in FIG. 2, FIG. 6 is a perspective view illustrating a heat sink 13 illustrated in FIG. 2, and FIG. 7 is a plane view of the heat sink 13 illustrated in FIG. 6.

The control device 28 according to the first embodiment includes the housing 15, the relay member 1A, and a control board 18. The housing 15 includes a housing projecting portion 40 which projects in a radial direction, and the housing projecting portion 40 has a housing hole portion 16 formed therethrough. The relay member 1A is housed inside the housing 15, and includes a relay-member main body 45 and control-section connection terminals 5, 6, 7, and 23 formed integrally with the relay-member main body 45. The control board 18 is housed inside the housing 15, and includes electronic components 22 to be electrically connected to the control-section connection terminals 23 to perform computation processing on external signals. The control board 18 and the relay member 1A constitute a control section.

The control device 28 further includes the heat sink 13, an external-connection connector 8, and a cover 17. The heat sink 13 comes into surface contact with the relay member 1A to close an opening portion of the housing 15 having a cylindrical shape with a closed end. The heat sink 13 includes a heat-sink projecting portion 41 projecting in the radial direction. The external-connection connector 8 includes connector connection terminals 9, 10, and 11 to be electrically connected to the control-section connection terminals 5, 6, and 7. The cover 17 is fixed onto an upper surface of the housing projecting portion 40 by housing screws 19 to cover the housing hole portion 16.

A heat-sink hole portion 14 formed through the heat-sink projecting portion 41 has the same shape as the housing hole portion 16, that is, a curved shape.

The external-connection connector 8 includes a connector housing 43 and a retaining portion 44. The connector housing 43 is fixed onto a lower surface of the heat-sink projecting portion 41 by heat-sink screws 20. The retaining portion 44 is formed integrally with the connector housing 43, and retains the connector connection terminals 9, 10, and 11 extended externally. The retaining portion 44 is fitted into the heat-sink hole portion 14 formed through the heat-sink projecting portion 41.

The connector connection terminals 9, 10, and 11 and the control-section connection terminals 5, 6, and 7, which extend in the vertical direction, are arranged so as to be opposed to each other. The connector connection terminals 9, 10, and 11 and the control-section connection terminals 5, 6, and 7 pass through the housing hole portion 16 to be electrically connected to each other at the respective distal end portions.

Screw holes 12a are formed through both end portions of the connector housing 43. A pitch between the pair of screw holes 12a is equal to each of a pitch between a pair of screw holes 12b formed on both sides of the heat-sink hole portion 14 of the heat sink 13 and a pitch between a pair of screw holes 12c formed on both sides of the housing hole portion 16 of the housing projecting portion 40.

The pitch between the pair of screw holes 12a of the connector housing 43 is also equal to a pitch between a pair of screw holes 12d formed through both end portions of the cover 17.

In the following, a method of manufacturing the control device 28 having the above-mentioned configuration is described.

Figure 10:
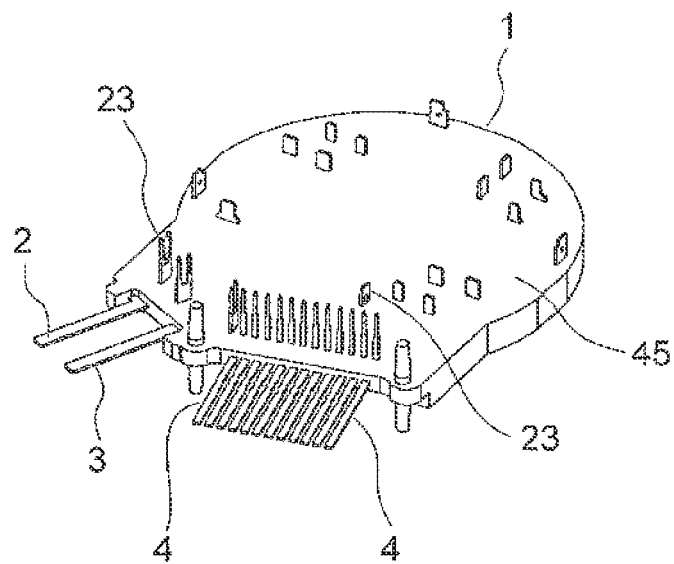
FIG. 10 is a perspective view illustrating the relay member before modifying the relay member illustrated in FIG. 5.

FIG. 10 is a perspective view illustrating a relay member obtained immediately after insert molding (the relay member obtained immediately after the insert molding is hereinafter referred as "relay member 1").

The relay member 1 includes control-section connection terminals 2, 3, and 4, which project from an end surface of a peripheral edge of the relay-member main body 45 in a horizontal direction, and the control-section connection terminals 23, which project from the relay-member main body 45 in the vertical direction. The control-section connection terminals 23 have a function of retaining the control board 18 and a function of electrically connecting to the electronic components 22 of the electronic board 18.

Next, each of the control-section connection terminals 2, 3, and 4 is bent at 90 degrees to stand vertically, thereby forming the relay member 1A including the control-section connection terminals 5, 6, 7, and 23 as illustrated in FIG. 5.

Figure 11:
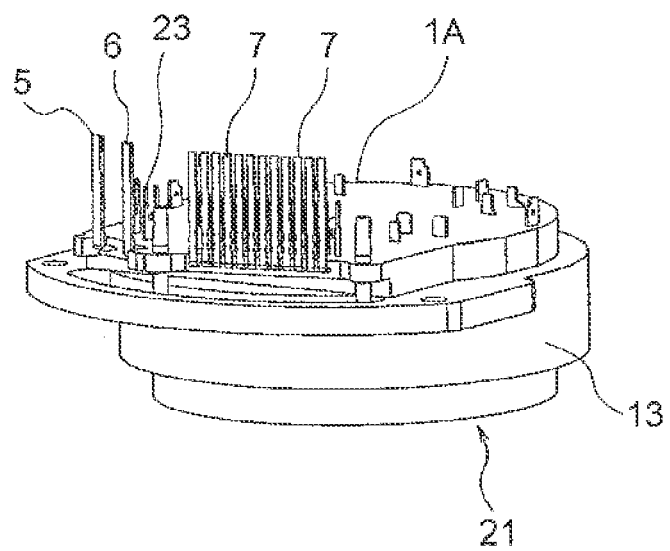
FIG. 11 is a perspective view illustrating a heat-sink assembly.

Thereafter, as illustrated in FIG. 11, a heat-sink assembly 21 is manufactured by integrating the heat sink 13 and the relay member 1A.

Figure 12:
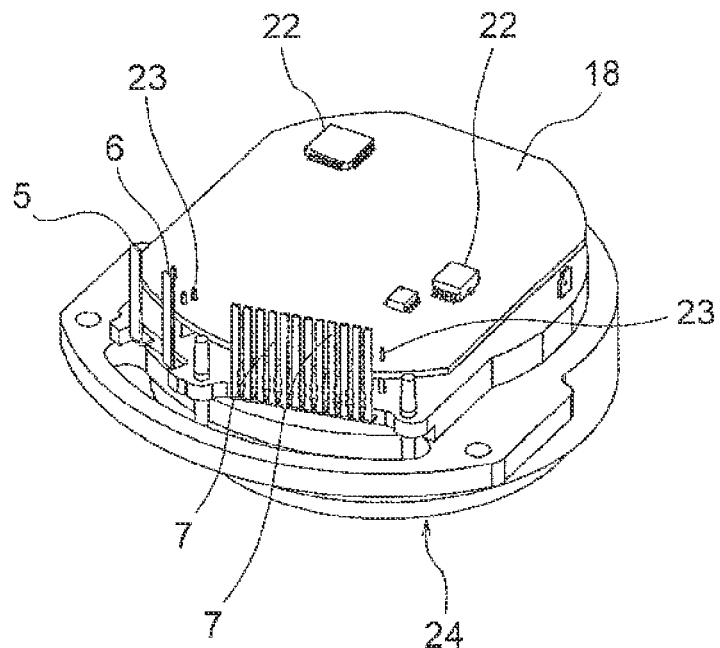
FIG. 12 is a perspective view illustrating a control-board assembly.

Next, as illustrated in FIG. 12, the relay member 1A and the control board 18 are electrically connected through the control-section connection terminals 23 of the relay member 1A to manufacture a control-board assembly 24.

Figure 13:
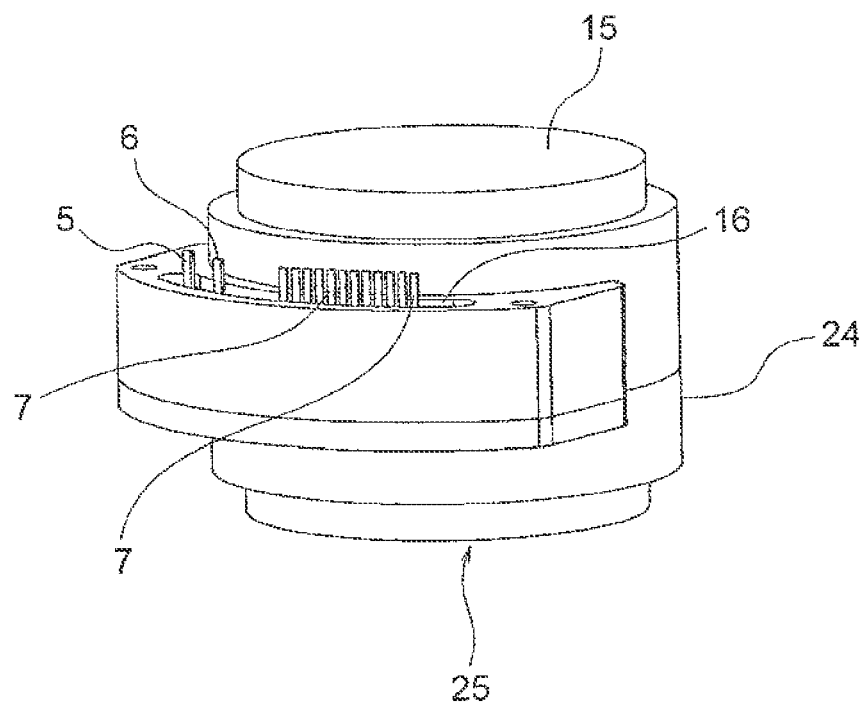
FIG. 13 is a perspective view illustrating a housing assembly.

Thereafter, as illustrated in FIG. 13, the control-section connection terminals 5, 6, and 7 are inserted into the housing hole portion 16 to assemble the housing 15 to the control-board assembly 24, thereby manufacturing a housing assembly 25.

Next, the retaining portion 44 of the external-connection connector 8 is fitted into the heat-sink hole portion 14 of the heat-sink projecting portion 41. The heat-sink screws 20 are screwed into the screw holes 12a of the external-connection connector 8 and the screw holes 12b of the heat sink 13 with central axes of the screw holes 12a and 12b being aligned with each other, thereby integrating the external-connection connector 8 and the heat sink 13.

Figure 14:
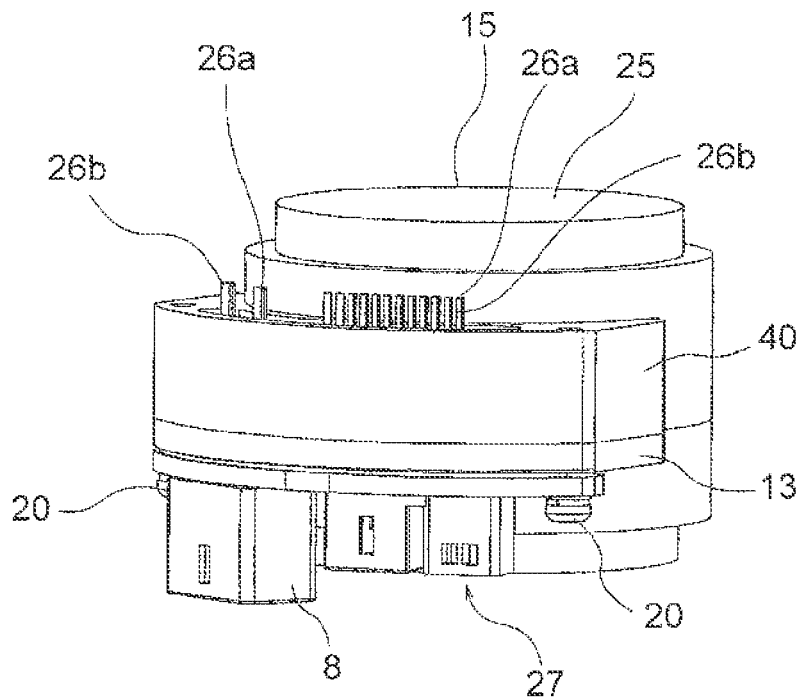
FIG. 14 is a perspective view illustrating a connector assembly.

Subsequently, distal end portions 26a of the control-section connection terminals 5, 6, and 7 and distal end portions 26b of the connector connection terminals 9, 10, and 11 are respectively electrically connected to each other to manufacture a connector assembly 27 illustrated in FIG. 14.

As a final step, the screw holes 12*d* of the cover 17 and the screw holes 12*c* of the housing projecting portion 40 are aligned with each other. In this state, the cover 17 is assembled to the connector assembly 27 by using the housing screws 19. In this manner, the manufacturing of the control device 28 is completed.

Figure 15:
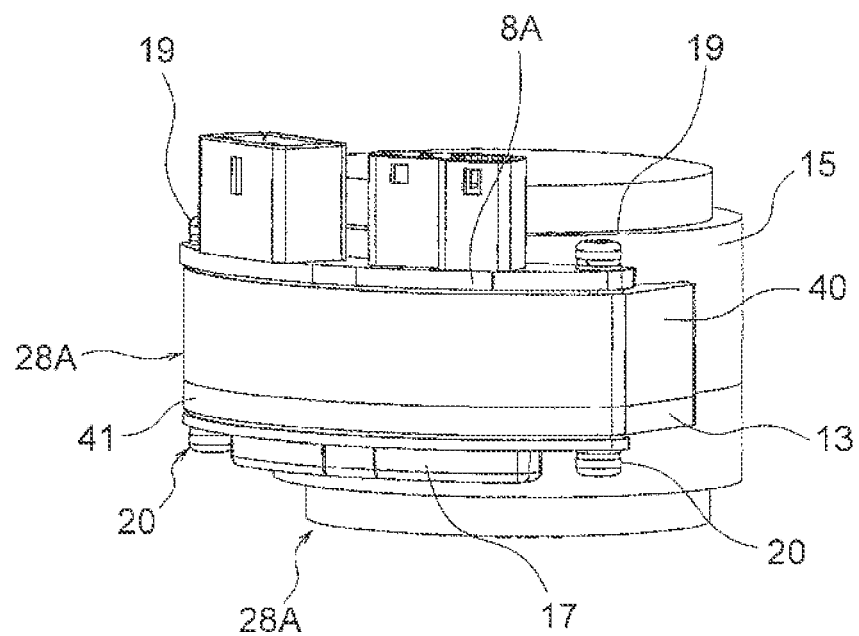
FIG. 15 is a perspective view illustrating a control device different from the control device illustrated in FIG. 1.

Next, a method of manufacturing a control device 28A is described. As illustrated in FIG. 15, the control device 28A has an external-connection connector 8A which is mounted at a position different from the position of the external-connection connector 8 mounted to the control device 28 illustrated in FIG. 1 by 180 degrees.

Figure 16:
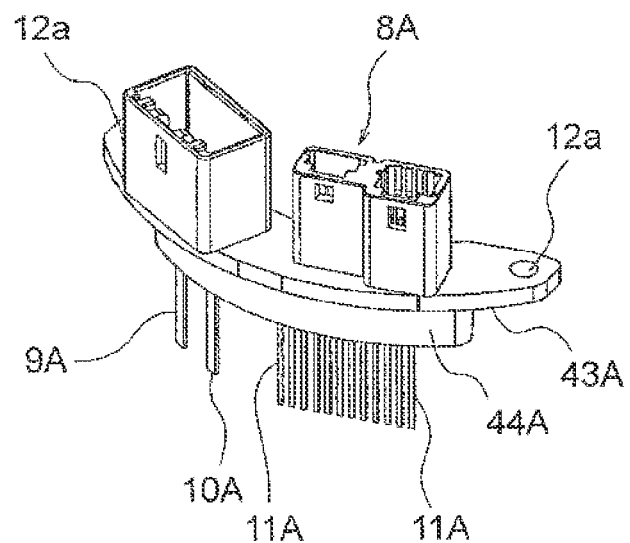
FIG. 16 is a perspective view illustrating an external-connection connector different from the external-connection connector illustrated in FIG. 8.

The control device 28A differs from the control device 28 only in the external-connection connector 8A illustrated in FIG. 16 in terms of used components. The same housing 15, heat sink 13, and control board 18 are used for both the control devices 28 and 28A. Moreover, the relay member 1 illustrated in FIG. 10 is also used for the control device 28A.

The external-connection connector 8A illustrated in FIG. 16 includes a connector housing 43A and a retaining portion 44A. The connector housing 43A is fixed onto the upper surface of the housing projecting portion 40 by the housing screws 19. The retaining portion 44A is formed integrally with the connector housing 43A and retains connector connection terminals 9A, 10A, and 11A which are extended externally.

The retaining portion 44A is fitted into the housing hole portion 16 of the housing 15.

The pitch between the pair of screw holes 12*a* formed through both end portions of the connector housing 43A is equal to each of the pitch between the pair of screw holes 12*b* of the heat sink 13, the pitch between the pair of screw holes 12*c* of the housing 15, and the pitch between the pair of screw holes 12*d* of the cover 17.

Figure 17:
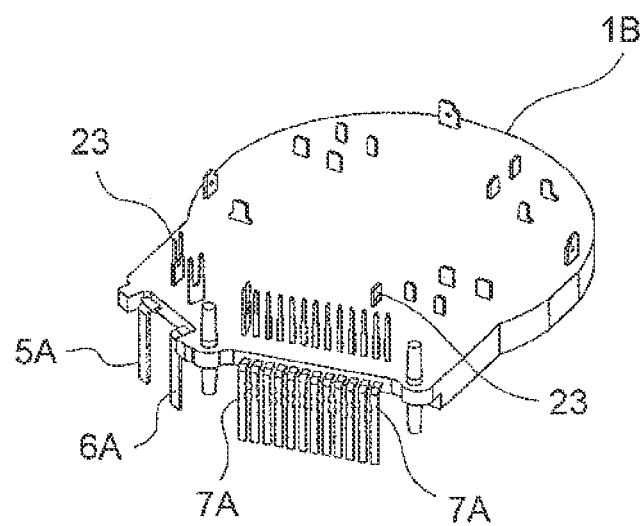
FIG. 17 is a perspective view illustrating a relay member different from the relay member illustrated in FIG. 5.

First, in contrast to the relay member 1A illustrated in FIG. 5, each of the control-section connection terminals 2, 3, and 4 is bent at 90 degrees in the direction opposite to that of the control-section connection terminals 5, 6, and 7 to stand vertically. In this manner, a relay member 1B including control-section connection terminals 5A, 6A, and 7A is formed as illustrated in FIG. 17.

Figure 18:
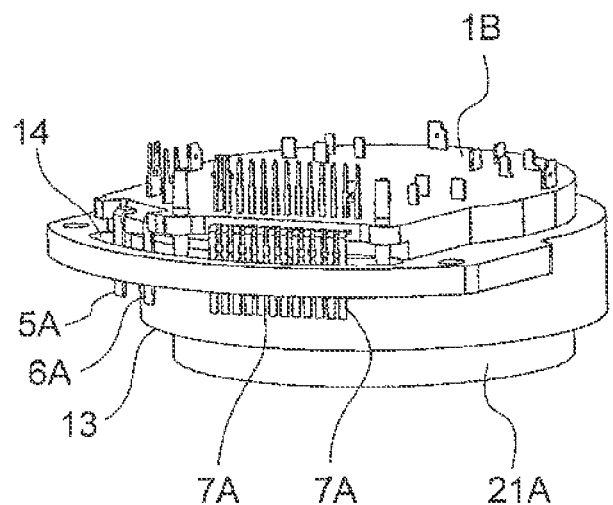
FIG. 18 is a perspective view illustrating a heat-sink assembly.

Thereafter, as illustrated in FIG. 18, the control-section connection terminals 5A, 6A, and 7A are inserted into the heat-sink hole portion 14 to integrate the heat sink 13 and the relay member 1B, thereby manufacturing a heat-sink assembly 21A.

Next, the control board 18 is placed on the relay member 1B of the heat-sink assembly 21A so as to be electrically connected thereto, thereby manufacturing a control-board assembly.

Thereafter, the housing 15 is assembled to the control-board assembly to manufacture a housing assembly.

Figure 19:
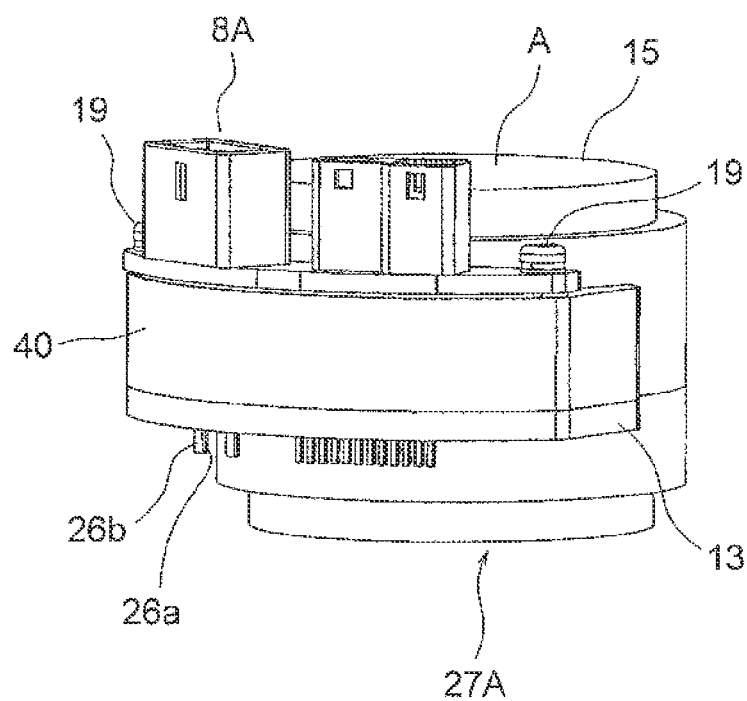
FIG. 19 is a perspective view illustrating a connector assembly.
Figure 20:
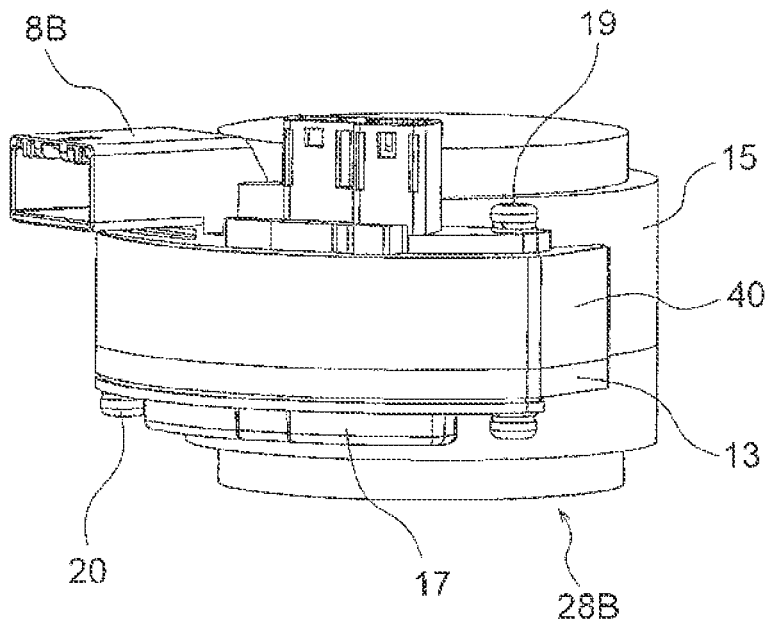
FIG. 20 is a perspective view illustrating a modification of a control device.
Figure 21:
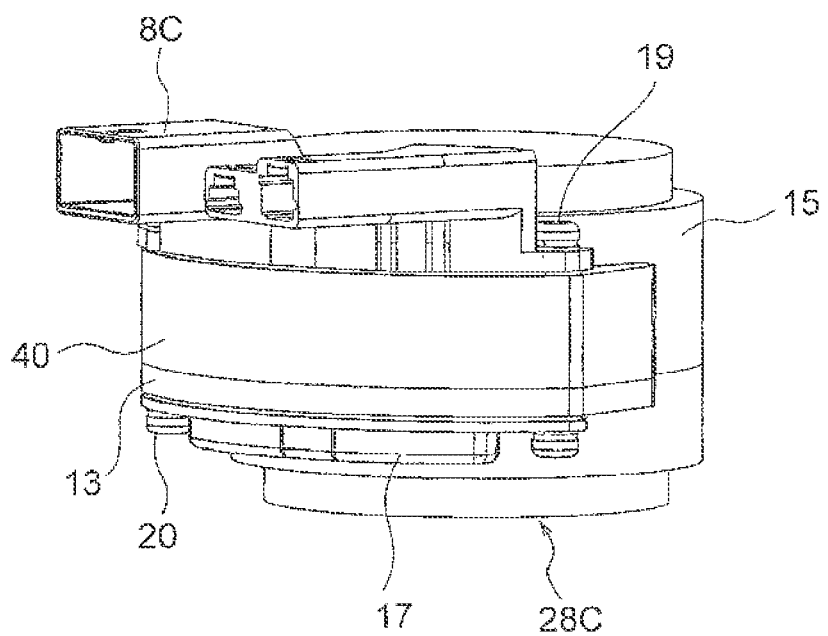
FIG. 21 is a perspective view illustrating a modification of a control device.
Figure 22:
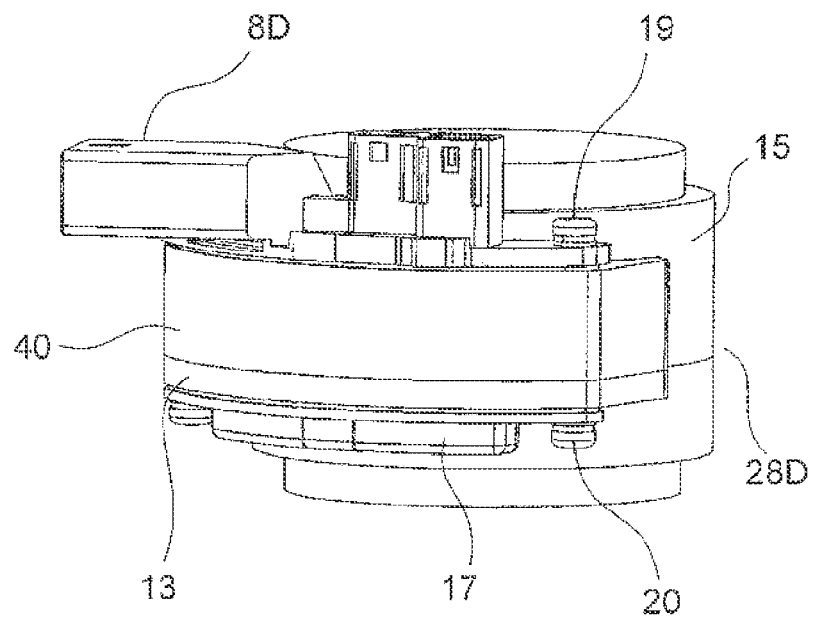
FIG. 22 is a perspective view illustrating a modification of a control device.
Figure 23:
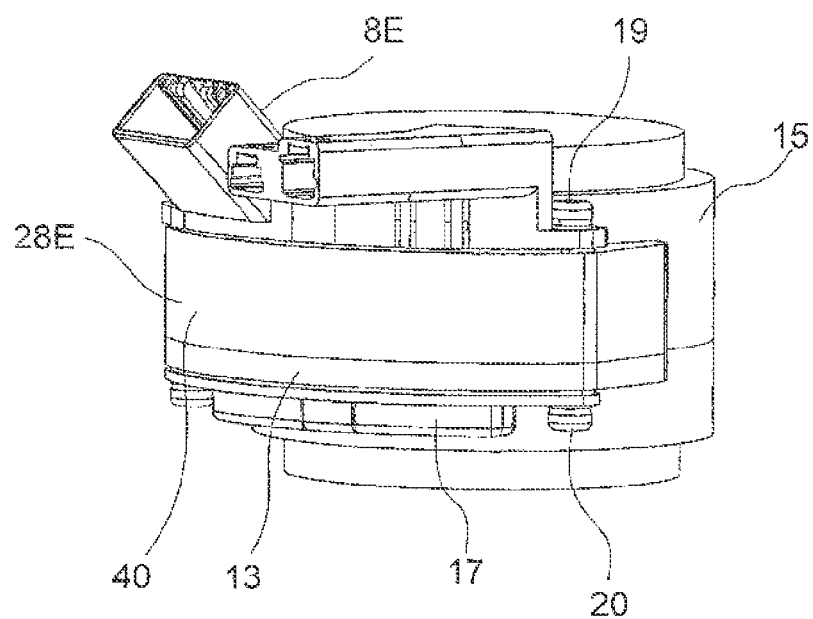
FIG. 23 is a perspective view illustrating a modification of a control device.

Next, as illustrated in FIG. 19, the retaining portion 44A of the external-connection connector 8A is fitted into the housing hole portion 16 of the housing 15, and the connector connection terminals 9A, 10A, and 11A of the external-connection connector 8A are inserted into the heat-sink hole portion 14. Thereafter, the housing assembly and the external-connection connector 8A are integrated by using the housing screws 19.

Subsequently, the distal end portions 26*a* of the control-section connection terminals 5A, 6A, and 7A and the distal end portions 26*b* of the connector connection terminals 9A, 10A, and 11A are respectively electrically connected to each other to manufacture a connector assembly 27A.

As a final step, the cover 17 is fixed to the heat sink 13 by using the heat-sink screws 20, and is then assembled to the connector assembly 27A. In this manner, the manufacturing of the control device 28A illustrated in FIG. 15 is completed.

As can be understood from FIGS. 1 and 15, the external-connection connector 8A of the control device 28A described above is mounted at the position inverted at 180 degrees from the position of the external-connection connector 8 of the control device 28. The present invention is also applicable to, for example, each of control devices 28B, 28C, 28D, and 28E illustrated in FIGS. 20 to 23. The control devices 28B to 28E respectively include external-connection connectors 8B, 8C, 8D, and 8E having different shapes.

Specifically, although the control devices 28B to 28E differ from each other in the shapes of the external-connection connectors 8B to 8E, the same housing 15, heat sink 13, control board 18, and relay member 1 as those of the control devices 28 and 28A are used.

Even for each of the control devices 28B, 28C, and 28D, and 28E, the mounting position of each of the external-connection connectors 8B, 8C, 8D, and 8E can be changed by 180 degrees.

As described above, each of the control devices 28, 28A, 28B, 28C, 28D, and 28E according to the first embodiment includes the housing 15 having a cylindrical shape with a closed end, the housing 15 including the housing projecting portion 40 projecting in the radial direction, and the housing hole 16 formed through the housing projecting portion 40, the control section housed inside the housing 15, the control section including the control-section connection terminals 5 (5A), 6 (6A), 7 (7A), and 23, to which the external signals are input from the outside of the housing 15, and the electronic components 22 for performing the computation processing on the external signals, the heat sink 13 including the heat-sink projecting portion 41 projecting in the radial direction, and the heat-sink hole portion 14 formed through the heat-sink projecting portion 41, for closing the opening portion of the housing 15, the external-connection connector 8 (8A, 8B, 8C, 8D, 8E) to be fixed to one of the housing projecting portion 40 and the heat-sink projecting portion 41, the external-connection connector 8 (8A, 8B, 8C, 8D, 8E) including the connector connection terminals 9 (9A), 10 (10A), and 11 (11A) to be electrically connected to the control-section terminals 5 (5A), 6 (6A), and 7(7A), and the cover 17 to be fixed to another of the housing projecting portion 40 and the heat-sink projecting portion 41. The connector connection terminals 9 (9A), 10 (10A), and 11 (11A) and the control-section terminals 5 (5A), 6 (6A), and 7(7A) pass through one of the housing hole portion 16 and the heat-sink hole portion 14, which is covered with the cover 17, so as to be electrically connected to each other at the respective distal end portions.

Therefore, when the control device 28 (28A, 28B, 28C, 28D, 28E) having a different mounting direction of the external-connection connector 8 (8A, 8B, 8C, 8D, 8E) or including a different type of the external-connection connector 8 (8A, 8B, 8C, 8D, 8E) is required, only the external-connection connector 8 (8A, 8B, 8C, 8D, 8E) of the control device 28 (28A, 28B, 28C, 28D, 28E) is required to be changed while the same housing 15, heat sink 13, and control board 18 can be used. Therefore, the manufacturing cost of the control devices 28, 28A, 28B, 28C, 28D, and 28E can be remarkably reduced.

Moreover, the control section includes the relay member 1A (1B) including the relay-member main body 45 and the control-section connection terminals 5 (5A), 6 (6A), 7(7A), and 23 formed integrally with the relay-member main body 45, and the control board 18 including the electronic components 22 to be electrically connected to the control-section connection terminals 23. The control-section connection terminals 5 (5A), 6 (6A), and 7(7A) are bent at a right angle with respect to the relay-member main body 45 to extend therefrom.

Therefore, when the mounting position of the external-connection connector 8 (8A, 8B, 8C, 8D, 8E) is to be inverted at 180 degrees, the relay member 1 including the control-section connection terminals 2, 3, and 4 extending externally along the surface of the relay-member main body 45 is used so that the control-section connection terminals 2, 3, and 4 are bent at a right angle along a direction in which the connector connection terminals 9 (9A), 10 (10A), and 11 (11A) extend. Therefore, the same relay member 1A (1B) can be used.

Moreover, the external-connection connector 8 (8A, 8B, 8C, 8D, 8E) includes the connector connection terminals 9(9A), 10 (10A), and 11 (11A), the connector housing 43 fixed to a surface of one of the housing projecting portion 40 and the heat-sink projecting portion 41, and the retaining portion 44 formed integrally with the connector housing 43, for retaining the connector connection terminals 9(9A), 10 (10A), and 11 (11A) extended externally. The retaining portion 44 is fitted into one of the housing hole portion 16 and the heat-sink hole portion 14.

Accordingly, each of the external-connection connectors 8, 8A, 8B, 8C, 8D, and 8E can be easily positioned in a predetermined position with respect to the housing 15 and the heat sink 13.

Moreover, when the external-connection connector 8 (8A, 8B, 8C, 8D, 8E) is fixed to any one of the housing projecting portion 40 and the heat-sink projecting portion 41, the connector connection terminals 9(9A), 10 (10A), and 11 (11A) are respectively opposed to the control-section connection terminals 5 (5A), 6 (6A), and 7 (7A).

Therefore, workability in electrical connection between the external-connection connector 8 (8A, 8B, 8C, 8D, 8E) and control-section connection terminals 5 (5A), 6 (6A), and 7 (7A) is improved.

The pitches between the pair of screw holes 12a, between the pair of screw holes 12c, and between the pair of screw holes 12d, for connecting the housing 15 and one of the cover 17 and the external-connection connector 8 (8A, 8B, 8C, 8D, 8E) to each other, are equal to each other. The pitches between the pair of screw holes 12a, between the pair of screw holes 12b, and between the pair of screw holes 12d, for connecting the heat sink 13 and one of the external-connection connector 8 (8A, 8B, 8C, 8D, 8E) and the cover 17 to each other, are equal to each other.

Thus, fastening workability for each of the housing 15, the cover 17, the external-connection connector 8 (8A, 8B, 8C, 8D, 8E), and the heat sink 13 using the screws is improved.

Although the control section includes two members, that is, the control board 18 and the relay member 1A (1B) in the embodiment described above, the relay member may be omitted from the control device.

Moreover, although the screws 19 and 20 are used to connect the cover 17, the external-connection connector 8 (8A, 8B, 8C, 8D, 8E), the housing 15, and the heat sink 13, the screws may be replaced by, for example, bolts and nuts.

Second Embodiment

Figure 24:
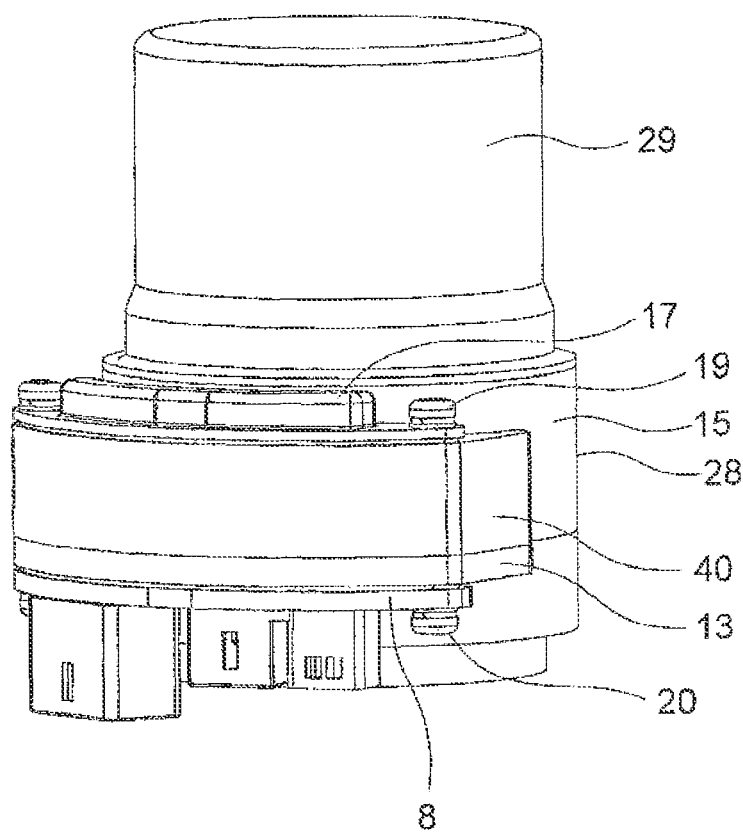
FIG. 24 is a perspective view illustrating a control device according to a second embodiment of the present invention.

FIG. 24 is a perspective view illustrating a motor for an electric power steering device, which is a rotating electric machine integral with a control device, obtained by assembling a motor 29 to the control device 28 illustrated in FIG. 1.

Figure 25:
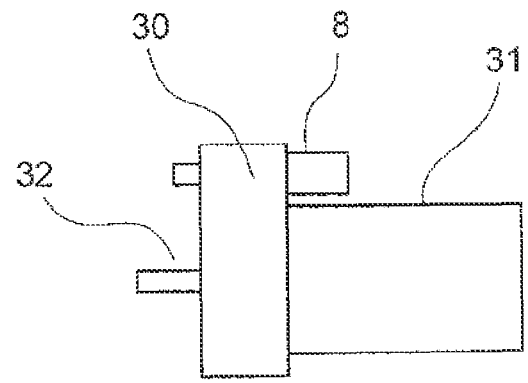
FIG. 25 is schematic diagram illustrating one motor integral with a control device.

The motor integral with the control device illustrated in FIG. 24 is a so-called "front type" motor integral with a control device. FIG. 25 is a schematic diagram illustrating the "front type" motor integral with a control device. The "front type" one includes a control device 30 provided on a pick-up side of an output shaft 32 of a motor 31.

Figure 26:
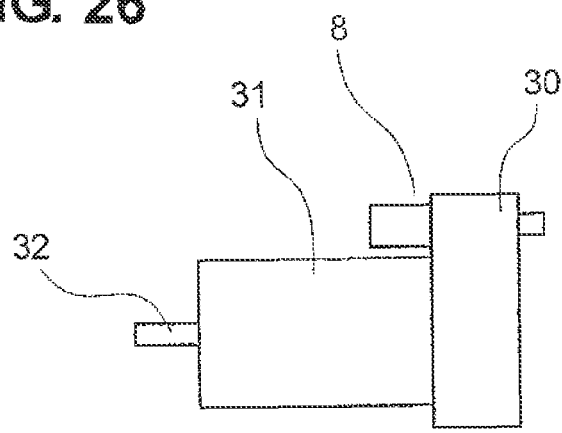
FIG. 26 is schematic diagram illustrating another motor integral with a control device.

FIG. 26 is a schematic diagram illustrating a "rear type" motor integral with a control device. The rear type one includes the control device 30 provided on the side opposite to the pick-up side of the output shaft 32 of the motor 31.

Figure 27:
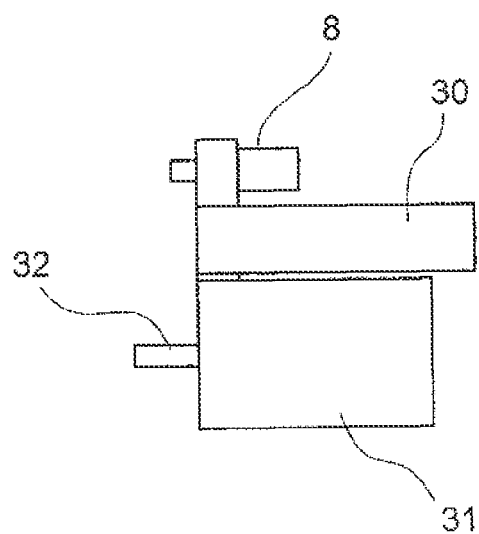
FIG. 27 is schematic diagram illustrating still another motor integral with a control device.

FIG. 27 is a schematic diagram illustrating an "add-on type" motor integral with a control device. The add-one type one includes the control device 30 provided in parallel to the output shaft 32 of the motor 31.

The above-mentioned motors for an electric power steering device differ from each other in the arrangement of the external-connection connector 8 of the control device 30. However, the same housing 15, heat sink 13, and control board 18 are used in the control device 30 of the respective types of the motors integral with the control device. Moreover, for the motors illustrated in FIGS. 25 and 26, the same relay member 1 is also used.

Therefore, in the motor for an electric power steering device according to the second embodiment, even for the motor integral with the control device which has a different mounting direction of the external-connection connector 8 or includes a different type of the external-connection connector 8, the same housing 15, heat sink 13, and control board 18 can be used. Accordingly, the manufacturing cost can be remarkably reduced.

Although the motor integral with the control device has been described as the rotating electric machine integral with the control device in the second embodiment, a power generator may be used in place of the motor.

What is claimed is:

1. A control device, comprising:
   a housing having a cylindrical shape with a closed end, the housing including a housing projecting portion, and a housing hole portion formed through the housing projecting portion projecting in a radial direction;
   a control section housed inside the housing, the control section including control-section connection terminals, to which an external signal is input from outside of the housing, and an electronic component for performing computation processing on the external signal;
   a heat sink including a heat-sink projecting portion, and a heat-sink hole portion formed through the heat-sink projecting portion projecting in the radial direction, for closing an opening portion of the housing;
   an external-connection connector to be fixed to one of the housing projecting portion and the heat-sink projecting portion, the external-connection connector including connector connection terminals to be electrically connected to the control-section connection terminals; and
   a cover to be fixed to another of the housing projecting portion and the heat-sink projecting portion,
   wherein the connector connection terminals and the control-section connection terminals pass through one of the housing hole portion and the heat-sink hole portion, which is covered with the cover, so as to be electrically connected to each other at respective distal end portions,
   wherein the housing hole portion and the heat sink hole portion are substantially the same shape.

2. The control device according to claim 1, wherein the control section comprises:
   a relay member including a relay-member main body and the control-section connection terminals formed integrally with the relay-member main body; and
   a control board including the electronic component to be electrically connected to the control-section connection terminals.

3. The control device according to claim 2, wherein the external-connection connector comprises:
the connector connection terminals;
a connector housing fixed to a surface of the one of the housing projecting portion and the heat-sink projecting portion; and
a retaining portion formed integrally with the connector housing, for retaining the connector connection terminals extended externally.

4. The control device according to claim 3, wherein the retaining portion is fitted into the one of the housing hole portion and the heat-sink hole portion.

5. The control device according to claim 1, wherein, when the external-connection connector is fixed to the one of the housing projecting portion and the heat-sink projecting portion, the connector connection terminals are respectively opposed to the control-section connection terminals.

6. A control device, comprising
a housing having a cylindrical shape with a closed end, the housing including a housing projecting portion, and a housing hole portion formed through the housing projecting portion projecting in a radial direction;
a control section housed inside the housing, the control section including control-section connection terminals, to which an external signal is input from outside of the housing, and an electronic component for performing computation processing on the external signal;
a heat sink including a heat-sink projecting portion, and a heat-sink hole portion formed through the heat-sink projecting portion projecting in the radial direction, for closing an opening portion of the housing;
an external-connection connector to be fixed to one of the housing projecting portion and the heat-sink projecting portion, the external-connection connector including connector connection terminals to be electrically connected to the control-section connection terminals; and
a cover to be fixed to another of the housing projecting portion and the heat-sink projecting portion,
wherein the connector connection terminals and the control-section connection terminals pass through one of the housing hole portion and the heat-sink hole portion, which is covered with the cover, so as to be electrically connected to each other at respective distal end portions,
wherein the control section comprises:
a relay member including a relay-member main body and the control-section connection terminals formed integrally with the relay-member main body; and
a control board including the electronic component to be electrically connected to the control-section connection terminals,
wherein the control-section connection terminals are bent at a right angle with respect to the relay-member main body to extend therefrom.

7. A control device, comprising
a housing having a cylindrical shape with a closed end, the housing including a housing projecting portion, and a housing hole portion formed through the housing projecting portion projecting in a radial direction;
a control section housed inside the housing, the control section including control-section connection terminals, to which an external signal is input from outside of the housing, and an electronic component for performing computation processing on the external signal;
a heat sink including a heat-sink projecting portion, and a heat-sink hole portion formed through the heat-sink projecting portion projecting in the radial direction, for closing an opening portion of the housing;
an external-connection connector to be fixed to one of the housing projecting portion and the heat-sink projecting portion, the external-connection connector including connector connection terminals to be electrically connected to the control-section connection terminals; and
a cover to be fixed to another of the housing projecting portion and the heat-sink projecting portion,
wherein the connector connection terminals and the control-section connection terminals pass through one of the housing hole portion and the heat-sink hole portion, which is covered with the cover, so as to be electrically connected to each other at respective distal end portions,
wherein a pitch between a pair of screw holes of the housing, a pitch between a pair of screw holes of the cover, and a pitch between a pair of screw holes of the external-connection connector, for connecting the housing and one of the cover and the external-connection connector to each other, are equal to each other, and a pitch between a pair of screw holes of the heat sink, the pitch between the pair of screw holes of the external-connection connector, and the pitch between the pair of screw holes of the cover, for connecting the heat sink and one of the external-connection connector and the cover to each other, are equal to each other.

8. A rotating electric machine integral with the control device, which is configured so that the control device according to claim 1 is mounted to an externally projecting side of an output shaft of the rotating electric machine.

9. A rotating electric machine integral with the control device, which is configured so that the control device according to claim 1 is mounted to an opposite side of an externally projecting side of an output shaft of the rotating electric machine.

10. A rotating electric machine integral with the control device, which is configured so that the control device according to claim 1 is provided in parallel to an output shaft of the rotating electric machine.

11. A rotating electric machine integral with the control device according to claim 8, wherein the rotating electric machine integral with the control device comprises a motor for an electric power steering device.

* * * * *